United States Patent
Lubitz et al.

(10) Patent No.: US 7,309,944 B2
(45) Date of Patent: Dec. 18, 2007

(54) PIEZOACTUATOR AND METHOD FOR PRODUCTION OF THE PIEZOACTUATOR

(75) Inventors: Karl Lubitz, Ottobrunn (DE); Hedwig Murmann-Biesenecker, Beikheim (DE); Andreas Wolff, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 252 days.

(21) Appl. No.: 10/522,818

(22) PCT Filed: Jul. 31, 2003

(86) PCT No.: PCT/DE03/02586

§ 371 (c)(1),
(2), (4) Date: Jan. 31, 2005

(87) PCT Pub. No.: WO2004/015789

PCT Pub. Date: Feb. 19, 2004

(65) Prior Publication Data

US 2005/0258713 A1    Nov. 24, 2005

(30) Foreign Application Priority Data

Jul. 31, 2002    (DE) ................................ 102 34 917

(51) Int. Cl.
    *H01L 41/08*    (2006.01)
(52) U.S. Cl. ........................................ 310/328; 310/330
(58) Field of Classification Search ................ 310/328, 310/330–332
    See application file for complete search history.

(56) References Cited

U.S. PATENT DOCUMENTS

| | | | | |
|---|---|---|---|---|
| 3,731,124 A | * | 5/1973 | Bryant | 310/326 |
| 4,593,160 A | * | 6/1986 | Nakamura | 381/163 |
| 4,595,338 A | * | 6/1986 | Kolm et al. | 416/81 |
| 5,589,725 A | | 12/1996 | Haertling | |
| 6,274,967 B1 | | 8/2001 | Zumstrull et al. | |
| 6,655,654 B1 | * | 12/2003 | Cotton et al. | 251/129.06 |
| 6,771,005 B2 | * | 8/2004 | Cotton, III | 310/328 |

FOREIGN PATENT DOCUMENTS

| | | |
|---|---|---|
| DE | 39 16 539 | 11/1990 |
| EP | 0 954 037 | 11/1999 |

* cited by examiner

Primary Examiner—Mark Budd
(74) Attorney, Agent, or Firm—Young & Thompson

(57) ABSTRACT

A piezoactuator, includes at least one stacked piezoelement, with at least two electrode layers, arranged one over the other along a stacking direction of the piezoelement, at least one piezoelectric layer, arranged between two of the electrode layers and at least one pre-tensioning device, for introduction of force into a volume of the piezoelectric layer via at least one force introduction surface on the piezoelectric layer, which is arranged on at least one of the surface sections facing the pretensioning device. The force introduction surface is smaller than the surface section of the piezoelectric layer and the volume is a partial volume of the piezoelectric layer. The production of the piezoactuator is achieved by introduction of a force into the partial volume of the piezoelectric layer via the force introduction surface on the piezoelectric layer.

18 Claims, 4 Drawing Sheets

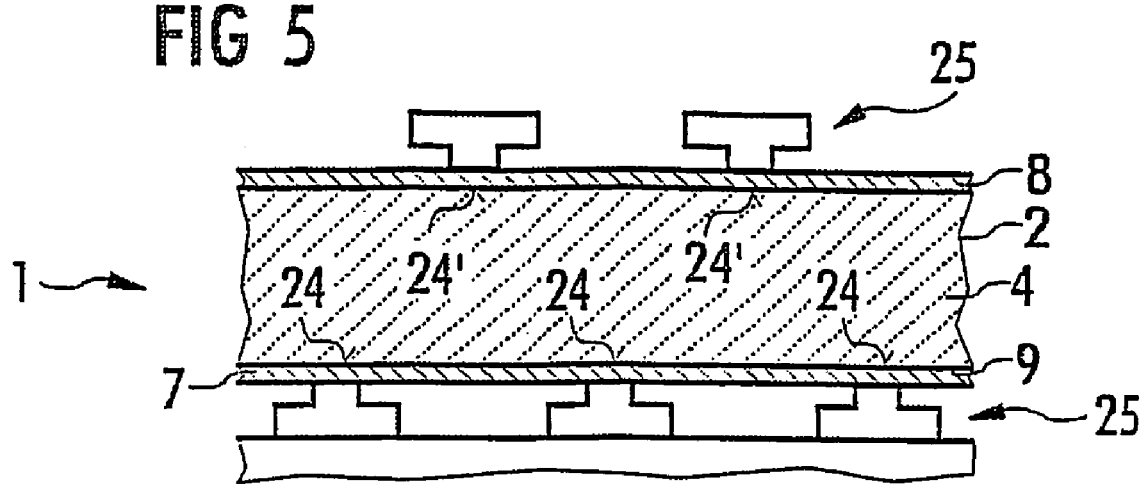
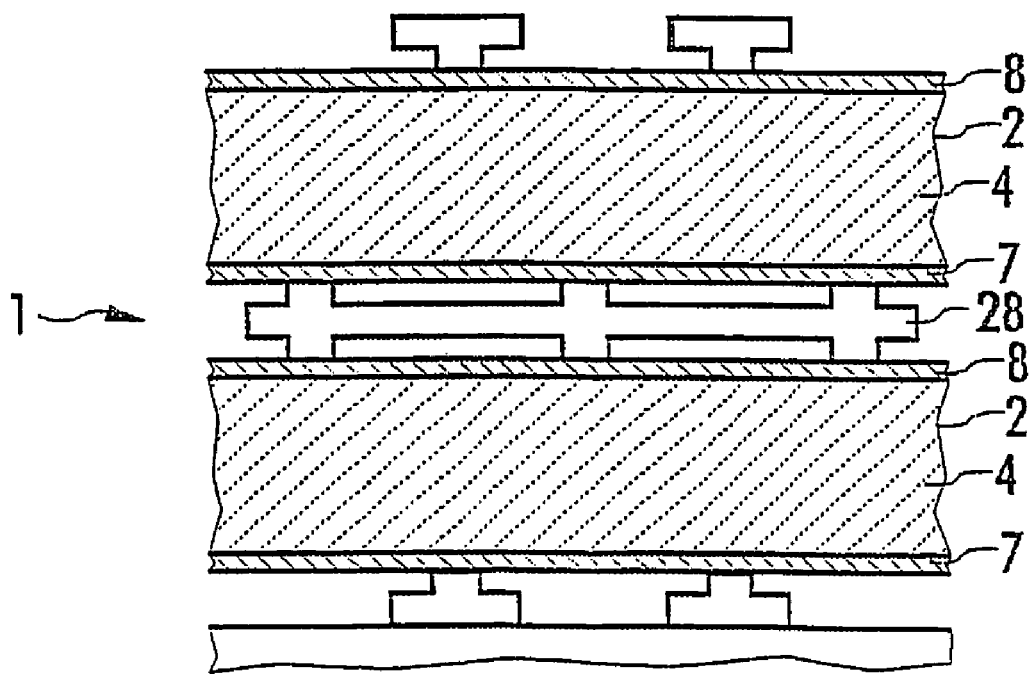

PIEZOACTUATOR AND METHOD FOR PRODUCTION OF THE PIEZOACTUATOR

CROSS REFERENCE TO RELATED APPLICATIONS

This is the 35 USC 371 National Stage of International Application PCT/DE2003/002586 filed on 31 Jul 2003, which designated the United States of America.

The invention relates to a piezoactuator comprising at least one stacked piezoelement with at least two electrode layers, arranged one over the other along a stacking direction of the piezoelement, at least one piezoelectric layer, arranged between two of the electrode layers, and at least one pretensioning device, for introduction of force into a volume of the piezoelectric layer by means of at least one force introduction surface on the piezoelectric layer, which is arranged on at least one of the surface sections facing the pretensioning device. A method for production of the piezoactuator is also specified.

BACKGROUND OF THE INVENTION

A piezoactuator of the said kind is known from US 6 274 967 B1. The piezoactuator has a piezoelement constructed in multiple layers. In such a piezoelement a plurality of electrode layers and piezoelectric layers are stacked alternately one over the other. The piezoelectric layers consist of a piezo-ceramic material. The pretensioning device for the introduction of force into the respective volume of the individual piezoelectric layers consists of a hollow, cylindrical spring element, an actuator cover and an actuator bottom plate. The piezoelement together with both its end faces is pre-tensioned between the actuator cover and the actuator bottom plate by means of the spring element. A force is introduced into a total volume of each of the piezoelectric layers with the aid of the pretensioning device. A unidirectional compressive tension is applied to the piezoelectric layers along the stacking direction. Introduction of the force or compressive tension causes a switching of domains. The domains are preferably polarized transverse to the direction of force introduction or the stacking direction.

In order to introduce the force into the total volume of each of the piezoelectric layers, each piezoelectric layer has surface sections which face away from one another and are aligned parallel to the end faces of the piezoelement. These surface sections face toward either the actuator cover or the actuator bottom plate of the pretensioning device. The surface sections are the same size as the end faces of the piezoelement. The force is introduced into the total volume of the piezoelectric layer in each case via the total surface section of the piezoelectric layer.

The known piezoactuator is used for example to activate an injection valve in what is known as a common rail injection system. For this purpose it is necessary that both a defined displacement and a defined force can be transmitted along the stacking direction.

A dimension for the displaceability of the piezoelectric material in the direction of an applied electrical field strength is known as the piezoelectric loading constant $d_{33}$. One possible way to obtain a relatively large displacement at a given value of $d_{33}$ would be to increase the total height of the piezoelement. Alternatively a relatively large displacement can be obtained by introducing a force or a unidirectional compressive tension along the stacking direction of the piezoelement. For this purpose the statistically distributed ferro-electrical domains are switched by means of a so-called ferro-elastic process preferably transverse to the applied compressive tension or transverse to the stacking direction, for example in an unpolarized piezoelement. This gives rise to a permanent shortening of the piezoelement. This shortened piezoelement is electrically activated. Applying an electrical field parallel to the stacking direction causes domain switching with a preferred direction parallel to the applied electrical field. Significantly more domains are switched in comparison with the piezoelement that has no compressive pretensioning. As a result there is a greater displacement of the piezoelement in the stacking direction when compared to the piezoelement that has no compressive pretensioning.

For it to be possible to use this means to obtain greater displacement in a stacked piezoelement constructed in multiple monolithic layers, a force of over 100 N would be necessary in the case of, for example, a basic piezoelement surface area of 1×1 mm². In the case of a basic surface area of 5×5 mm² a force of around 2.5 kN would be needed. This can only be accomplished with the aid of a stiff spring with a corresponding loss of no-load displacement.

However, using compressive pretensioning to increase the displacement is not only a problem for piezoactuators on the macro-scale. In particular, using compressive pretensioning to increase displacement is unsuitable for producing a piezoactuator with a relatively large displacement and force translation on the micro-scale.

SUMMARY OF THE INVENTION

The object of the invention is to provide an actuator which can be used as a micro-actuator and which has a very large relative displacement in comparison with the known prior art.

This object is achieved by means of a piezoactuator comprising at least one stacked piezoelement with at least two electrode layers, arranged one over the other along a stacking direction of the piezoelement, at least one piezoelectric layer, arranged between two of the electrode layers, and at least one pretensioning device, for introduction of force into a volume of the piezoelectric layer by means of at least one force introduction surface on the piezoelectric layer, which is arranged on at least one of the surface sections facing the pretensioning device. The piezoactuator is characterized in that the force introduction surface is smaller than the surface section of the piezoelectric layer and that the volume is a partial volume of the piezoelectric layer. This partial volume is effective as an actuator.

The object is further achieved in that a method is specified for producing the piezoactuator by introducing a force into the partial volume of the piezoelectric layer by means of the force introduction surface on the piezoelectric layer. The force is introduced in such a way that, in the partial volume of the piezoelectric layer, a polarization is generated transverse to the stacking direction. The polarization of the domains in the partial volume is preferably oriented transverse to the stacking direction. This makes the partial volume effective as an actuator.

Preferably the piezoelement is in a non-electrically activated state. No electrical field is applied. Along the stacking direction, the pretensioning device introduces indirectly via the force introduction surfaces a locally limited force or a locally limited mechanical compressive stress in a partial volume of the piezoelectric layer. Due to this mechanical compressive stress, the ferroelectrical domains statistically distributed in the partial volume of the piezoelectric layer in an unpolarized piezoelectric layer or oriented parallel to the pressure introduction in a normally polarized piezoelectric layer are switched in a preferred direction transverse to the applied mechanical compressive tension. This causes a permanent deformation or rather shortening of the piezoelectric layer in the region of the partial volume. A thickness of the piezoelectric layer is reduced in size. This results in a deformed or rather shortened piezoelement.

If the piezoelement created in this way is activated by an electrical field strength in the direction of polarity (parallel to the stacking direction), all domains both inside and outside the partial volume of the piezoelectric layer are switched approximately parallel to the direction of polarity. The piezoactuator in the region of the partial volume of the piezoelectric layer remains under compressive stress during this switching process. However, an increased displacement is measured in the stacking direction of the piezoelement. The increased displacement is the result of an increased $d_{33}$ value.

In a particular embodiment, a plurality of force introduction surfaces are distributed over the piezoelectric layer in such a way that the introduction of force causes a bending of the piezoelectric layer. For example the piezoelectric layer is a piezo-ceramic layer made from lead zirconate titanate. The bending initiated by the introduction of force results from an elastic deflection of the piezoelectric layer. If the force introduction surfaces, a thickness of the piezo-ceramic layer and the introduced force are suitably matched, a ferro-elastic deflection can be superimposed on the elastic deflection. A displacement which can be measured on the pretensioning device consists of a reduction in the deflection, an increase in the thickness of the piezo-ceramic layer due to 90° domain switching and an increase in the thickness of the layer due to the normal piezo effect. Relative to an initial thickness of the piezoelectric layer, $d_{33}$ values of up to 15 000 pm/V are measured for a typical field strength of 1 kV/mm. This corresponds to an increase in displacement by a factor of 10 relative to previous actuator solutions.

A particular embodiment uses a partial volume extending along an entire thickness of the piezoelectric layer. A partial volume is created extending from one surface section of the piezoelectric layer to the other surface section. The partial volume pervades the entire piezoelectric layer in the thickness direction.

It is preferable for virtually complete polarization to be generated transverse to the stacking direction in this partial volume. The mechanical compressive stress causes almost complete domain switching transverse to the incoming compressive stress to be reached or exceeded in the partial volume. The compressive stress to be applied for this purpose depends on the piezoelectric material used in the piezoelectric layer. The compressive stress typically decreases in direct proportion to the decrease in the Curie temperature $T_c$ or the coercive field strength $E_c$ of the piezoelectric material.

In a particular embodiment, at least one of the designs chosen for the pretensioning device and/or piezoelement for generating the force introduction surface takes the form of a spherical cup (spherical cap), frustum of a cone, cuboid, ring and/or cylinder. A prism is also possible. These designs in particular enable force introduction surfaces to be produced in both pointlike and stripe form. Pointlike means that the force introduction surface can be described by a circular or near circular surface. Such a force introduction surface, as also in the case of a ring, can be not only round but also oval or square. For example the pretensioning device has a stamp in the form of a cuboid with a square base surface area or in the form of a cylinder with a round base surface area. These base surface areas are used to transfer the mechanical compressive stress to the piezoelement. The mechanical compressive stress corresponding to the base surface area of the stamp is introduced via a round or square force introduction surface of the piezoelectric layer in the partial volume of the piezoelectric layer. If the cuboid has a rectangular base surface area, the force is introduced along a stripe-shaped force introduction surface into a correspondingly shaped partial volume of the piezoelectric layer. In the case of a cylinder it is also possible for the force not to be introduced via a base surface area but rather via an area of the cylindrical surface. This is then typically a line-shaped force introduction surface.

It is also possible for the force introduction surfaces to be produced with the aid of a structured electrode layer of the piezoelement. Structured electrode layers enable the force to be introduced into the piezoelectric layer at specific locations only. The introduction of a force produces domain switching exclusively at these locations. All known microstructuring methods may be used for structuring the electrode layer.

In a particular embodiment, a plurality of partial volumes are generated in the piezoelectric layer. In this case the partial volumes are preferably separate from one another. This means that switching of the polarization of the domains is generated transverse to the stacking direction via a plurality of force introduction surfaces in the piezoelectric layer. In this force introduction surfaces in the piezoelectric layer. In this case preferably the same compressive stress is introduced via the force introduction surfaces. This typically means that when the force introduction surfaces are the same size, equal force is brought to bear on each of the force introduction surfaces via the pretensioning device.

In particular there are at least three force introduction surfaces, evenly distributed over the surface section of the piezoelectric layer. With three evenly distributed force introduction surfaces, it is relatively easy to introduce the same compressive stress into the partial volumes. The force is increased due to the enlargement of the total force introduction surface. Greater force must be exerted for the purpose of force introduction. However, there is greater force to draw upon.

In a particular embodiment there are at least three force introduction surfaces, arranged in a row on the surface section of the piezoelectric layer. With this arrangement it is for instance possible for stripe-shaped force introduction surfaces to be distributed parallel to one another over the surface section. Another possibility is for a plurality of pointlike force introduction surfaces to form a matrix of force introduction surfaces. This then results in a corresponding matrix of partial volumes in the piezoelectric layer.

The force introduction surfaces arranged on surface sections of the piezoelectric layer which face away from one another can be different in both shape and size. For example the force introduction surface on one of the surface sections is pointlike. However the force introduction surface on the other surface section can take the form of a stripe.

In a particular embodiment, surface sections of the piezoelectric layer which face away from one another have virtually identical and/or differently shaped force introduction surfaces for the purpose of creating a partial volume extending in the thickness direction. Virtually identical in this case means that the force introduction surfaces are the same size to within 10%. Differently shaped force introductionsurfaces exist when for instance the force introduction surface on one surface section of the piezoelectric layer is pointlike and the other force introduction surface on the other surface section is ring-shaped. These force introduction surfaces are arranged one over the other in such a way that the pointlike force introduction surface is in the center of the ringshaped force introduction surface .

In a particular embodiment, the thickness selected for the piezoelectric layer is in the range 20 μm to 200 μm inclusive. It has been shown that at this layer thickness the application of even a small force brings about a significantly increased $d_{33}$ value.

In a particular embodiment, the extent of the force introduction surface virtually corresponds to the thickness of the piezoelectric layer. In a typical example the extent is a diameter or edge length of the force introduction surface. In the case of the combination of pointlike and ring-shaped force introduction surfaces described above, however, a diameter of the ring-shaped force introduction surface is significantly greater. The diameter of the ring typically comes to 500 μm. A diameter could even be as large as 1 mm.

In a particular embodiment, a plurality of piezoelements are stacked one over the other. In this case preferably at least two piezoelements are stacked over one another in such a way that force introduction surfaces of the piezoelements are arranged more or less flush one over the other. The partial volumes of a given piezoelectric layer are arranged one over the other in the stacking direction over the partial volumes of the piezoelectric layer of further piezoelements. This produces not only an unusually high displacement value for a given individual piezoelement, but also a piezoactuator with extremely large displacement. Any displacement is amplified as a result. The force that has to be applied in order to produce a large displacement in the volume of the piezoelectric layers is thus relatively small.

In summary the invention provides the following advantages in particular:

1 The way the force is introduced into a partial volume of the piezoelectric layer produces a piezoelement having a significantly greater displacement. This makes it possible to produce for instance a micro-actuator with an overall height of 1 mm and a displacement of 10 μm.

At half the no-load displacement of a micro-actuator a working force of 10-20 cN can be obtained.

The force and mechanical work can be amplified by suitably stacked piezoelements and used for a plurality of applications.

By linking piezo-ceramic multi-layer technology, microstructuring and micro-mechanics, the invention provides solutions for a plurality of application areas (micro-pumps, micro-valves, micro-motors, etc.).

BRIEF DESCRIPTION OF THE DRAWINGS

The invention will be described below in greater detail with the aid of several examples and the associated figures. The description of the invention discloses individual embodiments thereof which can be combined with one another in any form. The figures are diagrams and are not drawn to scale.

FIGS. 1 to 7 each show a section of a different piezoactuator as a side-view seen in cross-section.

DETAILED DESCRIPTION OF THE INVENTION

Figure 1:
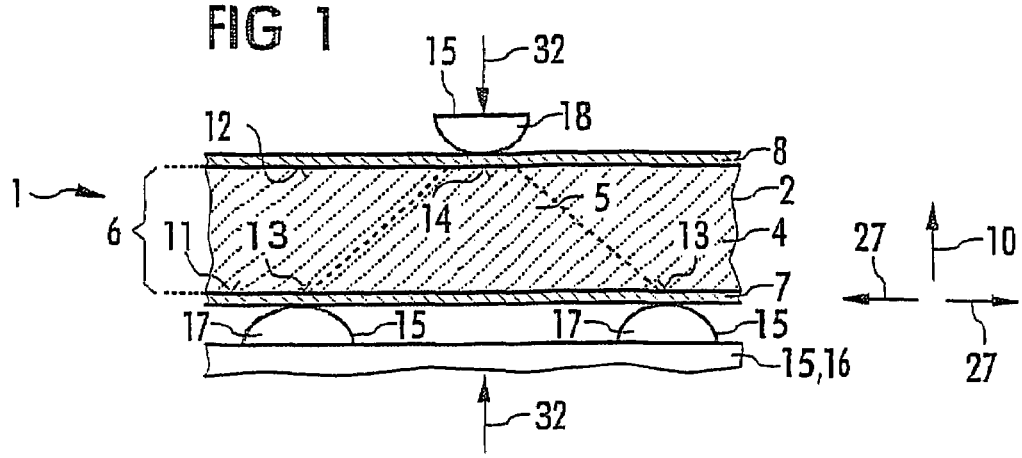
Figure 2:
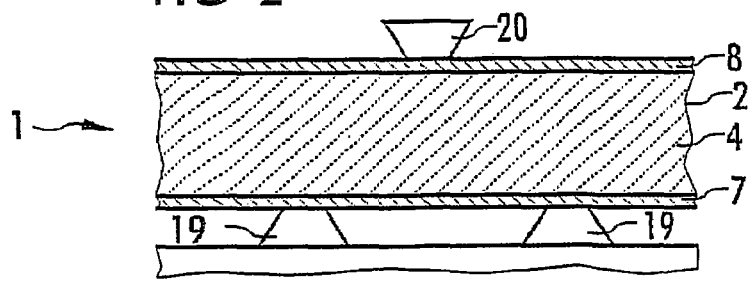
Figure 3:
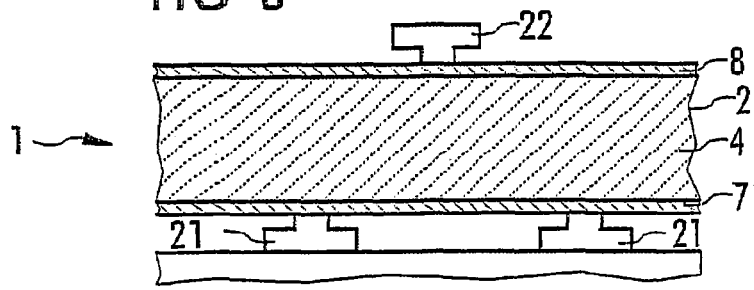

The piezoactuator 1 according to FIGS. 1 to 9 has in each case at least one stacked piezoelement 2 formed from two electrode layers 7 and 8 arranged one over the other along the one stacking direction 10 of the piezoelement 2 and one piezoelectric layer 4 arranged between the electrode layers 7 and 8. The piezoelectric layer 4 consists of a soft PZT (lead zirconate titanate). The Curie temperature $T_c$ is around 170° C. The coercive field strength $E_c$ of the soft PZT is 0.5 kV/mm. The thickness 6 of the piezoelectric layer 4 is around 120 μm.

The piezoactuator 1 has in each case a pretensioning device 15 for introduction of force into a partial volume 5 of the piezoelectric layer 4. A force 32 is introduced into the partial volume 5 of the piezoelectric layer 4 via the force introduction surfaces 13 and 14. The force introduction surfaces 13 and 14 are arranged on the surface sections 11 and 12 of the piezoelectric layer 4 facing the pretensioning device 15. The surface sections 11 and 12 are thus facing away from one another. At least one of the force introduction surfaces 13 or 14 is smaller than the associated surface section 11 or 12 of the piezoelectric layer 4.

For the purpose of creating the force introduction surfaces 13 and 14, the pretensioning device 15 is mechanically in contact with the electrode layers 7 and 8. The force introduction surfaces 13 and 14 of the surface sections 11 and 12 of the piezoelectric layer 4 are generated indirectly via the electrode layers 7 and 8. An extent of the force introduction surfaces 13 and 14 corresponds mainly to a respective mechanical contact surface between the pretensioning device 15 and the corresponding electrode layer 7 and 8.

The force introduction surfaces 13 and 14 are distributed over the piezoelectric layer 4 in the stacking direction 19 of the piezoelement 2 in such a way that the introduction of force generates bending of the piezoelectric layer 4.

Figure 8:
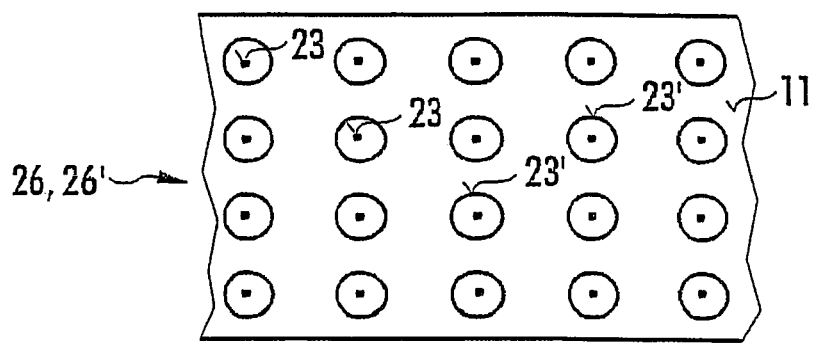
FIGS. 8 to 10 each show a section of a piezoelectric layer having force introduction surfaces, looking down on the piezoelectric layer from above.
Figure 11:
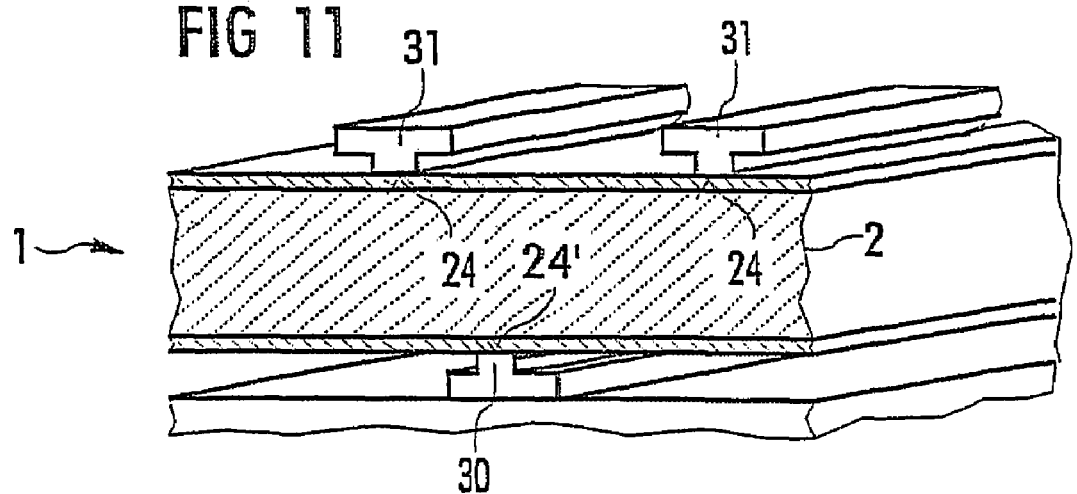
FIG. 11 shows a perspective view of a piezoactuator in which a stripe-shaped force introduction surface has been produced.

According to FIG. 1 the pretensioning device 15 has at least one spherical cup 18 and at least one support ring 17 (cf. FIG. 8, reference numbers 23 and 23 '). The support ring 17 has the cross-section of a spherical cup. The support ring 17 is connected to a base 16 of the pretensioning device 15. The force 32 to be introduced into the partial volume of the piezoelectric layer 4 is transmitted to the spherical cup 18 with the aid of a spring (not shown). The support ring 17 and the spherical cup 18 are positioned opposite one another and arranged so that they are in mechanical contact with one of the electrode layers 7 and 8 in each case. The spherical cup 18 leads to a pointlike force introduction surface 14. The diameter of the pointlike force introduction surface is about 50 μm. The support ring 17 leads to a ring-shaped force introduction surface 13 having a diameter of around 500 μm. The spherical cup 18 and the ring 17 are thus arranged in such a way that the pointlike force introduction surface 14 is arranged in the center of the ringshaped force introduction surface 13. Applying a compressive stress causes a force 4 to be introduced into the partial volume 5 of the piezoelectric layer 4 via the force introduction surfaces 13 and 14. As a result, a switching of the polarization 27 of the domains takes place in the partial volume 5 so that the polarization is transverse to the stacking direction 10. The partial volume 5 extends in the stacking direction 10 of the piezoelement 2 along the entire thickness 6 of the piezoelectric layer 4. Virtually complete polarization takes place in the partial volume 5. Unlike the previous example, the pointlike force introduction surface 14 is generated according to FIG. 2 with the aid of a frustum of a cone 20 and according to FIG. 3 with the aid of a cylinder 22. The support ring 17 has according to FIG. 2 the crosssection of a frustum of a cone 19 and according to FIG. 3 the crosssection of a cylinder 21. In a further embodiment according to FIG. 11, force introduction surfaces 24 and 24' are generated with the aid of cuboids 30 and 31 having a rectangular base surface area, and are arranged in sequence 25 or 25' (cf. FIG. 9).

Figure 4:
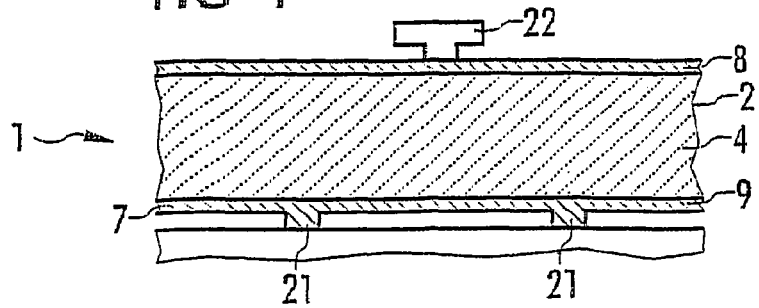

According to FIG. 4, both the pretensioning device 15 and the piezoelement 2 have cylinders 22 and 21 with a pointlike base surface area for the purpose of generating the force introduction surfaces. The cylinder 21 of the piezoelement 2 is produced with the aid of a structured electrode layer 9. The cylinders 22 of the pretensioning device 15 and the cylinders 21 of the piezoelement 2 are offset from one another relative to the stacking direction 10. The materials in the piezoelectric layer and the electrode layers are selected to enable the stack to bend. This makes it possible to obtain a particularly large increase in displacement when the compressive tension is applied.

Figure 9:
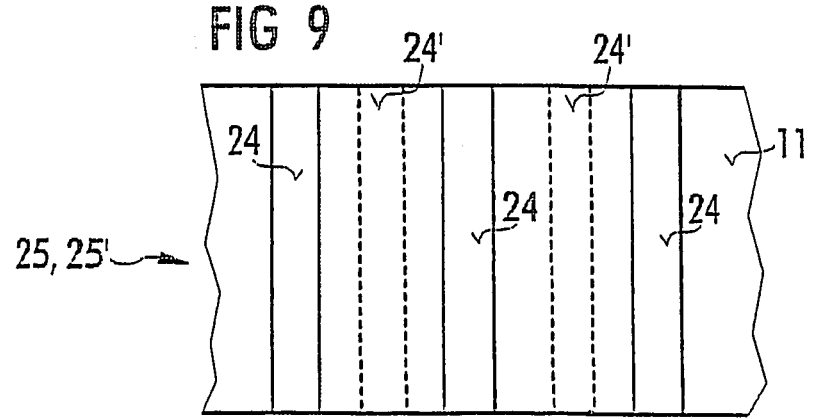
Figure 10:
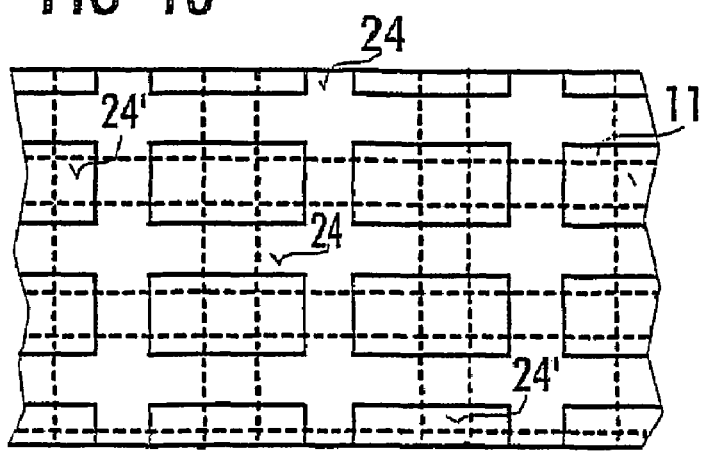

FIG. 5 shows a further embodiment in which a plurality of cylinders applied to the surface sections 11 and 12 are arranged in a row 25. If the base surface areas of the cylinders are stripe-shaped, this results in stripe-shaped force introduction surfaces 24 and 24' (FIG. 9). The force introduction surfaces 24 and 24' are offset from one another. FIG. 10 shows a variant of the stripe-shaped force introduction surfaces 24 and 24'. The stripe-shaped force introduction surfaces 24 and 24' are in each case connected with one another transverse to the lengthways direction of the stripes by bridging pieces. The force is introduced into the piezoelectric layer 4 in the manner of a mesh.

A further embodiment is shown in FIG. 8. A plurality of pointlike force introduction surfaces 23 are distributed over a surface section 11 and a plurality of ring-shaped force introduction surfaces 23' are distributed over the other surface section 12 of the piezoelectric layer 4 in the form of a matrix 26 and 26' in each case.

Figure 7:
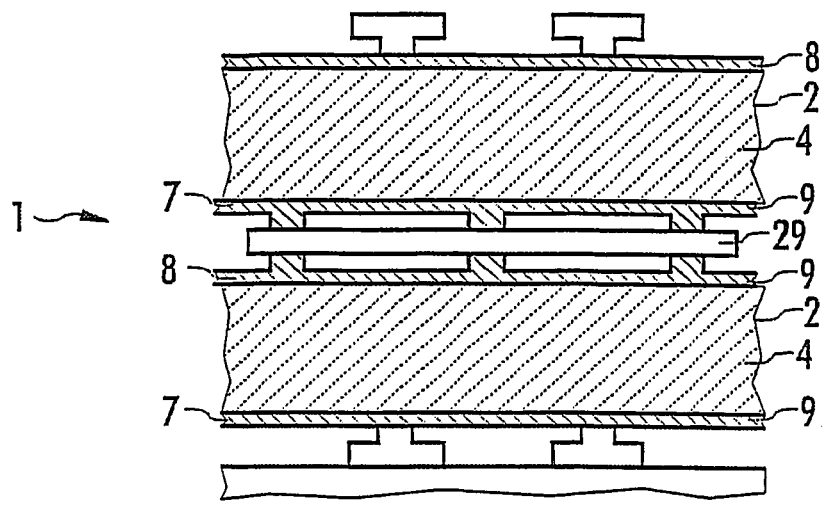

FIGS. 6 and 7 show two typical embodiments in which two piezoelements 2 are stacked in such a way that the force introduction surfaces 13, 14 of the piezoelements 2 are arranged flush one over the other. According to FIG. 6 a structured metal foil 28 is placed between the piezoelements 2 for the purpose of introducing the force into the piezoelectric layers 2.

On the other hand FIG. 7 shows an extension of the typical embodiment according to FIG. 4. The electrode layers 9 have at least some cylinders for introducing the force. The electrode layers 9 are structured. An intermediate metal foil 29 is arranged between the structured electrode layers 9 of the stacked piezoelements 2 for the purpose of adapting a frictional connection.

Figure 12:
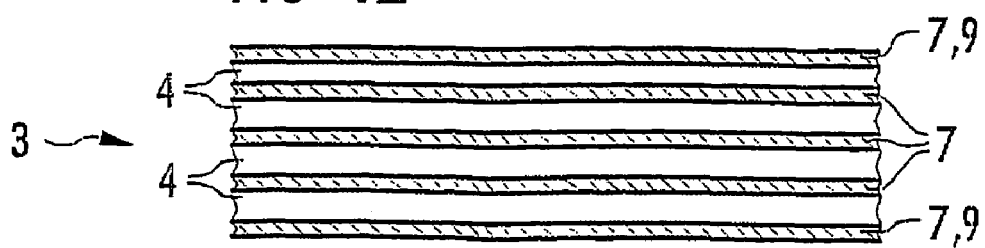
FIG. 12 shows a piezoelement constructed in multiple layers.

Further embodiments result from using piezoelements 3 constructed in multiple layers, in which a plurality of electrode layers 7 and piezoelectric layers 4 are arranged alternately one over the other (FIG. 12). According to a further embodiment the outer electrode layers 7 are structured electrode layers 9.

The test results listed in Table 1 were obtained on the basis of the piezoactuator 1 according to FIG. 1. A static force of 0.7 N was applied to the piezoelement 2. The piezoelectric loading constant $d_{33}$ was determined as a function both of the piezo-ceramic material and of the thickness 6 of the piezoelectric layer 4, at an electrical field strength of 1 kV/mm. Values of up to 15,000 pm/V may be obtained for $d_{33}$.

TABLE 1

| Test No. 1 | Piezo-ceramics | Curie temperature [° C.] | Coercive field strength [kV/mm] | Test thickness [μm] | $d_{33}$ [pm/V] |
|---|---|---|---|---|---|
| 1 | Soft PZT | 330 | 1.0 | 1000 | 650 |
| 2 | Soft PZT | 330 | 1.0 | 110 | 2200 |
| 3 | Soft PZT | 170 | 0.5 | 1000 | 1150 |
| 4 | Soft PZT | 170 | 0.5 | 260 | 1600 |
| 5 | Soft PZT | 170 | 0.5 | 120 | 15000 |
| 6 | Soft PZT | 120 | 0.3 | 1000 | 1400 |
| 7 | Soft PZT | 120 | 0.3 | 160 | 3500 |

The invention claimed is:

1. Piezoactuator (1) comprising
   at least one stacked piezoelement (2), with at least two electrode layers (7, 8, 9), arranged one over the other along a stacking direction (10) of the piezoelement (2), and at least one piezoelectric layer (4), arranged between two electrode layers (7, 8, 9), and
   at least one pretensioning device (15) for introduction of force (32) into a volume of the piezoelectric layer (4) by means of at least one force introduction surface (13, 14, 23, 24) on the piezoelectric layer (4), which is arranged on at least one of the surface sections (11, 12) of the piezoelectric layer (4) so that it faces the pretensioning device (15),
   wherein
   the force introduction surface (13, 14, 23, 24) is smaller than the surface section (11, 12) of the piezoelectric layer (4) and that the volume is a partial volume (5) of the piezoelectric layer (4);
   wherein a thickness (6) selected for the piezoelectric layer (4) is in the range 20 μm to 200 μm inclusive; and
   wherein an extent of the force introduction surface (13, 14, 23, 24) virtually corresponds to the thickness (6) of the piezoelectric layer (4).

2. Piezoactuator according to claim 1, wherein a plurality of force introduction surfaces (13, 14) are distributed over the piezoelectric layer (4) in such a way that the introduction of force causes a bending of the piezoelectric layer (4).

3. Piezoactuator according to claim 1 wherein the piezoelectric layer (4) comprises a surface section (11) having at least one force introduction surface (13), and a further surface section (12) facing away from the surface section (11) and having at least one further force introduction surface (14), and in which the force introduction surfaces (13, 14) are laterally offset from one another relative to the stacking direction (10) of the piezoelement (2).

4. Piezoactuator according to claim 1, wherein at least one of the designs chosen for the pretensioning device (15) and/or piezoelement (2) for generating the force introduction surface (13, 14, 23, 24) takes the form of a spherical cup (18), frustum of a cone (19, 29), cuboid (30, 31), ring (17) and/or cylinder (21, 22).

5. Piezoactuator according to claim 1, wherein the force introduction surface (23) is pointlike.

6. Piezoactuator according to claim 1, wherein the force introduction surface (24, 24') is stripe-shaped.

7. Piezoactuator according to claim 1, wherein the force introduction surface (23') is ring-shaped.

8. Piezoactuator according to claim 1, wherein there are at least three force introduction surfaces, evenly distributed over the surface section (11, 12) of the piezoelectric layer (4).

9. Piezoactuator according to claim 1, wherein there are at least three force introduction surfaces, arranged in a row (25) on the surface section (11, 12) of the piezoelectric layer (4).

10. Piezoactuator according to claim 1, wherein surface sections (11, 12) of the piezoelectric layer (4) which face away from one another have identical and/or differently shaped force introduction surfaces (13, 14, 23, 24) arranged along the stacking direction (10) and offset from one another.

11. Piezoactuator according to claim 1, wherein a plurality of piezoelements (2) are stacked one over the other.

12. Piezoactuator according to claim 11,
wherein at least two piezoelements (2) are stacked over one another in such a way that force introduction surfaces (13, 14, 23, 24) of the piezoelements (2) are arranged more or less flush one over the other.

13. Method for producing a piezoactuator (2) according to claim 1 by introducing a force (32) into a partial volume (5) of the piezoelectric layer (4) via the force introduction surface (13, 14, 23, 24) of the piezoelectric layer (4) in such a way that, in the partial volume (5) of the piezoelectric layer, a polarization (27) is generated transverse to the stacking direction (10).

14. Method according to claim 13, wherein a partial volume (5) extending along an entire thickness (6) of the piezoelectric layer (4) is used.

15. Method according to claim 13, wherein virtually complete polarization transverse to the stacking direction (10) is generated in the partial volume (5).

16. Method according to claim 14, wherein virtually complete polarization transverse to the stacking direction (10) is generated in the partial volume (5).

17. Piezoactuator according to claim 1, there being force introduction surfaces (13, 14, 23, 24) on opposite sides of the piezoelectric layer (4), which surfaces are smaller than the surface section (11, 12) of the piezoelectric layer (4).

18. Piezoelectric actuator according to claim 17, there being a plurality of said force introduction surfaces (13, 14, 23, 24) spaced apart on each side of the piezoelectric layer (4) and all smaller than the surface section (11, 12) of the piezoelectric layer (4), there being a plurality of said partial volumes (5) spaced apart within the piezoelectric layer (4).

* * * * *